US012550732B2

(12) United States Patent
Sharma et al.

(10) Patent No.: US 12,550,732 B2
(45) Date of Patent: Feb. 10, 2026

(54) SINGLE CONDUCTIVITY TYPE DEVICES FOR LOW TEMPERATURE COMPUTATION

(71) Applicant: Intel Corporation, Santa Clara, CA (US)

(72) Inventors: Abhishek Sharma, Portland, OR (US);
Wilfred Gomes, Portland, OR (US);
Pushkar Ranade, San Jose, CA (US);
Sagar Suthram, Portland, OR (US);
Rajabali Koduri, Saratoga, CA (US);
Anand Murthy, Portland, OR (US);
Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 804 days.

(21) Appl. No.: 17/711,837

(22) Filed: Apr. 1, 2022

(65) Prior Publication Data

US 2023/0317557 A1 Oct. 5, 2023

(51) Int. Cl.
*H01L 23/473* (2006.01)
*H01L 23/36* (2006.01)
*H10D 30/67* (2025.01)
*H10D 62/10* (2025.01)

(52) U.S. Cl.
CPC ............ *H01L 23/473* (2013.01); *H01L 23/36* (2013.01); *H10D 30/6735* (2025.01); *H10D 62/121* (2025.01)

(58) Field of Classification Search
CPC ... H01L 23/473; H01L 23/36; H10D 30/6735; H10D 62/121; H10D 30/6757
See application file for complete search history.

(56) References Cited

U.S. PATENT DOCUMENTS

2020/0243418 A1* 7/2020 Neal .................... H01L 21/4882
2021/0366819 A1* 11/2021 Chiang ............... H01L 23/3675

\* cited by examiner

*Primary Examiner* — Changhyun Yi
(74) *Attorney, Agent, or Firm* — Essential Patents Group, LLP

(57) ABSTRACT

Integrated circuit dies, systems, and techniques, are described herein related to single conductivity type transistor circuits operable at low temperatures. A system includes a functional circuit block of an integrated circuit die having a number of non-planar transistors all of the same conductivity type. The system further includes cooling structure integral to the integrated circuit die, coupled to the integrated circuit die, or both. The cooling structure is operable to remove heat from the integrated circuit die to achieve an operating temperature at the desired low temperature.

22 Claims, 11 Drawing Sheets

SINGLE CONDUCTIVITY TYPE DEVICES FOR LOW TEMPERATURE COMPUTATION

BACKGROUND

There is an ongoing need for improved computational devices to enable ever increasing demand for modeling complex systems, providing reduced computation times, and other considerations. In some contexts, scaling features of integrated circuits has been a driving force for such improvements. Other advancements have been made in materials, device structure, circuit layout, and so on.

In typical integrated circuit implementations, complementary metal-oxide-semiconductor (CMOS) field effect transistor (FET) devices are deployed. Such devices offer certain advantages as n-type MOS (NMOS) transistors and p-type MOS (PMOS) transistors may be advantageously deployed in different contexts (i.e., PMOS transistors to propagate 1s and NMOS transistors to propagate 0s). However, CMOS devices offer disadvantages such as fabrication complexity and other limitations.

It is with respect to these and other considerations that the present improvements have been needed. Such improvements may become critical as the desire to improve computational efficiency become even more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
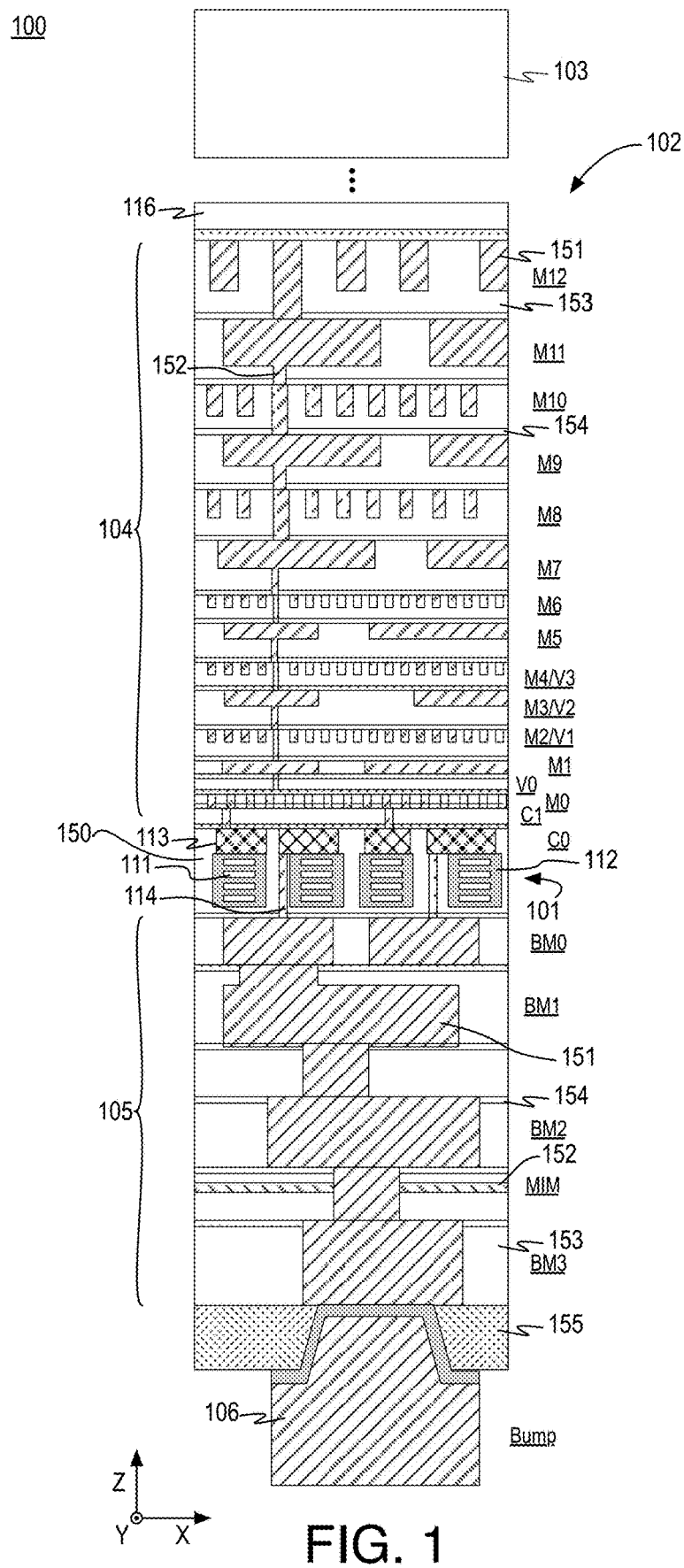
FIG. 1 illustrates a cross-sectional view of a low temperature non-planar transistor integrated circuit system.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. The terms "lateral", "laterally adjacent" and similar terms indicate two or more components are aligned along a plane orthogonal to a vertical direction of an overall structure. As used herein, the terms "monolithic", "monolithically integrated", and similar terms indicate the components of the monolithic overall structure form an indivisible whole not reasonably capable of being separated.

Integrated circuit dies, systems, and techniques are described herein related to single conductivity type (i.e., single MOS) non-planar transistor devices operable at very low temperatures for improved device performance.

As discussed, in typical integrated circuit implementations CMOS FET devices and circuits may be deployed. However, such devices and circuits have limitations. In some embodiments, an apparatus or device includes an integrated circuit (IC) die having only non-planar single conductivity type transistors (i.e., single MOS transistors) and a cooling structure operable to remove heat from the IC die to achieve an operating temperature at a very low temperature, such as, at or below 0° C. As used herein, the term cooling structure or active cooling structure indicates a device that uses power to provide cooling (e.g., via flow of a coolant, immersion in a coolant, etc.). Notably, the cooling structure or active cooling structure need not be in operation to be labeled as such. The active cooling structure may be part of the IC die, provided separate from the IC die, or both. In some contexts, an active cooling structure is not needed as the IC die is deployed in a very low temperature environment such as in any of a subpolar oceanic climate, a subarctic climate, an arctic climate, a tundra climate, an ice cap climate, or any other environment of sustained cold temperatures.

The single MOS transistors may be n-type MOS (NMOS) transistors or p-type MOS (PMOS) transistors, with NMOS transistors offering particular advantages. As used herein, an NMOS transistor is a transistor with n-type source and drain materials. For example, the source and drain may be an intrinsic semiconductor material doped with an n-type dopant such as phosphorous, arsenic, or antimony. Such NMOS transistors may be inversion type such that the channel semiconductor is p-type and, during operation, an inversion layer is formed in the channel to allow conduction of electrons through the channel A PMOS transistor is a transistor with p-type source and drain materials. For example, the source and drain may be an intrinsic semiconductor material optionally doped with a p-type dopant such as boron or gallium. Such PMOS transistors may again be inversion type such that the channel semiconductor is n-type and, during operation, an inversion layer is formed in the channel to allow conduction of holes through the channel. Although discussed with respect to n- and p-type doped semiconductor materials, any suitable material systems may be used.

The non-planar single MOS may have any non-planar architecture such that the gate of the device is operable on more than a single plane of the non-planar transistor. A planar transistor indicates a transistor having a single plane interface between the gate and channel structure thereof. As used herein the term non-planar transistor indicates a transistor having more than a single plane interface between the gate and channel structure. Such non-planar transistors may also be characterized as multi-gate devices, multi-gate MOSFETs, or the like. In some embodiments, the non-planar transistors are Fin FET devices where the gate is on two, three, or four sides of a fin of channel material. In some embodiments, the non-planar transistors are gate all around (GAA) FET devices where the gate surrounds one or more channel regions on all sides. Such channel regions may be nanowires or nanoribbons of channel material for example. In some embodiments, the non-planar transistors are nanosheet FET devices where the gate again surrounds one or more channel regions on all sides but, in contrast to GAA FET devices, the channel regions are nanosheets having a substantially greater width than height (i.e., a width to height ratio in the range of 2 to 10). Such channel nanosheet FET devices may also be characterized as multi-bride channel FET devices. In some embodiments, the non-planar transistors are floating Fin FET devices, which are similar to Fin FET devices with the sub-fin of the fin material removed such that a void is under the floating fin.

Such non-planar single MOS transistors are deployed in an entire functional circuit block and, in some embodiments, across an entire IC die (and wafer during fabrication). As used herein the term functional circuit block indicates a multiple transistor circuit to perform one or more circuit functions. Notably, a functional circuit block does not need to be in operation to be labeled as such. In some embodiments, the functional circuit block is a relatively small circuit block such as a NAND logic circuit to produce an output which is false only if all of its inputs are true. In some embodiments, the functional circuit block is a more complex block to perform one or more functions such as logic functions, control functions, arithmetic operations, graphic operations, etc. For example, a functional circuit block may be a processor core, a controller device, a programmable logic device, or a field programmable gate array. Other functional circuit blocks may be deployed. In some embodiments, the functional circuit block includes a large number of non-planar single MOS transistors. In some embodiments, a functional circuit block has not fewer than 100,000 non-planar single MOS transistors. In some embodiments, a functional circuit block has not fewer than $1 \times 10^6$ non-planar single MOS transistors. In some embodiments, a functional circuit block has not fewer than $1 \times 10^7$ non-planar single MOS transistors.

As discussed, the IC die including non-planar single MOS transistors are deployed in a very low temperature context. In some embodiments, the operating temperature of the IC die is maintained at or below 0° C. In some embodiments, the operating temperature of the IC die is maintained at or below about −196° C. (i.e., using liquid nitrogen as the coolant). In some embodiments, the operating temperature of the IC die is maintained at or below about −25° C. In some embodiments, the operating temperature of the IC die is maintained at or below about −50° C. In some embodiments, the operating temperature of the IC die is maintained at or below about −70° C. In some embodiments, the IC die is maintained at or below about −100° C. Other temperatures may be used based on coolant, environment, and so on.

In operation at very low temperatures, the non-planar single MOS transistors see a substantial boost in performance relative to operation at higher temperatures. In particular, non-planar NMOS transistors operation at very low temperatures have increased carrier mobility, reduced contact resistance, and reduced leakage. Furthermore, in some embodiments, the non-planar single MOS transistors may be powered from a back-side of the non-planar single MOS transistors for greatly reduced IR drop, particularly for non-planar NMOS transistor devices. Other advantages will be evident based on the following discussion.

FIG. 1 illustrates a cross-sectional view of a low temperature non-planar transistor integrated circuit system 100, arranged in accordance with at least some implementations of the present disclosure. In FIG. 1, an orthogonal to gate view is provided such that orthogonal to the gate refers to the gate of non-planar single MOS transistors 101.

IC system 100 includes a lateral surface along the x-y plane that may be defined or taken at any vertical position of IC system 100. The lateral surface of the x-y plane is orthogonal to a vertical or build up dimension as defined by the z-axis. IC system 100 may be formed from any substrate material suitable for the fabrication of transistor circuitry. In some embodiments, a semiconductor substrate is used to manufacture non-planar single MOS transistors 101 and other components of IC system 100. The semiconductor substrate may include a wafer or other piece of silicon or another semiconductor material. Suitable semiconductor substrates include, but are not limited to, single crystal silicon, poly crystalline silicon and silicon on insulator (SOI), as well as similar substrates formed of other semiconductor materials, such as gallium arsenide. The substrate may also include semiconductor materials, metals, dielectrics, dopants, and other materials commonly found in semiconductor substrates.

In FIG. 1, IC system 100 includes an IC die 102, which is a monolithic integrated circuit including non-planar single MOS transistors 101, front-side metallization layers 104 (or front-side interconnect layers), and optional back-side metallization layers 105 (or back-side interconnect layers). IC system 100 further includes a package level cooling structure 103, which may be deployed on or over front-side metallization layers 104 (as shown) or on or over a back-side of IC die 102. In some embodiments, package level cooling structure 103 is coupled to IC die 102 by an adhesion layer 116. Notably, IC system 100 may be deployed without back-side metallization layers 105. In such embodiments, signal routing and power are provided to non-planar single MOS transistors 101 via front-side metallization layers 104. However, use of back-side metallization layers 105 may offer advantages as discussed further herein below.

Non-planar single MOS transistors 101 deploy a single conductivity type transistor for a functional circuit block or an entirety of IC die 102. As shown, each of non-planar single MOS transistors 101 include channel regions 111, gate structures 112, and gate contacts 113. Each of non-planar single MOS transistors 101 also include source and drain structures, and source and drain contacts, which are not shown in the cross-section of FIG. 1. Such source and drain structures are illustrated herein below with respect to FIGS. 2-5. In the example of FIG. 1, nanosheet single MOS transistors are illustrated. However, IC system 100 may deploy any of Fin FETs, GAA FETs, or floating Fin FETs as discussed with respect to FIGS. 2-5.

Channel regions 111 may also be characterized as channel material or, simply, a channel. Non-planar single MOS transistors 101 each include one or more channel regions 111 between source and drain structures (e.g., source and drain semiconductors). Notably, for an entire functional circuit block or for the entirety of IC die 102, the source and drain structures are the same material as are the channel regions 111. In the context of NMOS transistors, the source and drain structures are n-type semiconductor materials. In such NMOS transistor context, the transistors may be inversion type such that channel regions 111 are p-type semiconductor materials. During operation, such p-type semiconductor materials may be inverted under control of gate structures 112 to provide an inversion layer for the conduction of electrons between the n-type source and drain materials. In the context of PMOS transistors, the source and drain structures are intrinsic or p-type semiconductor materials. In such PMOS transistor context, the transistors may be inversion type such that channel regions 111 are n-type semiconductor materials and, an inversion layer for the conduction of holes between the p-type source and drain materials is provided under control of gate structures 112.

In some embodiments, IC die 102 includes source and drain structures of only one conductivity type. In some embodiments, IC die 102 includes source and drain structures of only one dopant type (n-type or p-type). In some embodiments, IC die 102 includes channel regions 111 of only one conductivity type. In some embodiments, IC die 102 includes channel regions 111 of only one dopant type.

Gate structures 112 may include a gate dielectric layer on at least portions of channel regions 111 and between channel regions 111 and a gate electrode of gate structures 112, such that gate electrode controls channel regions 111 during operation. As shown, non-planar single MOS transistors 101 are embedded within dielectric material 150.

Interconnectivity of non-planar single MOS transistors 101, signal routing to and from non-planar single MOS transistors 101, power delivery to non-planar single MOS transistors 101, and routing to an outside device (not shown), is provided by front-side metallization layers 104, optional back-side metallization layers 105, and package level interconnects 106. In the example of FIG. 1, package level interconnects 106 are provided on or over a back-side of IC die 102 as bumps over a passivation layer 155. However, package level interconnects 106 may be provided using any suitable interconnect structures such as bond pads, solder bumps, etc. Furthermore, in some embodiments, package level interconnects 106 are provided on or over a front-side of IC die 102 (i.e., over front-side metallization layers 104) and package level cooling structure 103 is provided on or over a back-side of IC die 102 (i.e., adjacent non-planar single MOS transistors 101).

As used herein, the term metallization layer indicates metal interconnections or wires that provide electrical routing. Adjacent metallization layers, such as metallization interconnects 151, are interconnected by vias, such as vias 152, that may be characterized as part of the metallization layers or between the metallization layers. As shown, in some embodiments, front-side metallization layers 104 are formed over and immediately adjacent non-planar single MOS transistors 101. As used herein, the term front- and back-side are used in their ordinary meaning in the art based on the build up direction of IC die 102 with the front-side being the side exposed during processing of the substrate used to fabricate non-planar single MOS transistors 101. The back-side is then the opposite side, which may be exposed during processing by attaching the front-side to a carrier wafer and exposing the back-side (e.g., by back-side grind or etch operations) as known in the art.

In some embodiments, front-side metallization layers 104 provide signal routing to non-planar single MOS transistors 101 and back-side metallization layers 105 provide power delivery, as enabled by through-contacts 114, to non-planar single MOS transistors 101. For example, implementation of single MOS functional circuit blocks as discussed herein may be advantageously attainable based at least in part on deployment at very low temperature and back-side power delivery as provided by back-side metallization layers 105. As discussed, such very low temperature operation provides advantages for non-planar single MOS transistors 101 inclusive of increased carrier mobility, reduced contact resistance (e.g., at the interface between source and drain semiconductor and source and drain contact metal), and reduced leakage. In addition or in the alternative, back-side power delivery as provided by back-side metallization layers 105 improves performance, particular in the context of NMOS non-planar single MOS transistors 101. For example, back-side power delivery as provided by back-side metallization layers 105 reduces IR drop in the power delivery (e.g., in the power rails). Notably, high IR drop is a particular problem is single MOS circuits. For example, when power delivery (i.e., Vcc, Vss) is at a great distance (as may be the case when delivered via front-side metallization layers 104), resistance and capacitance in the power delivery can cause single MOS circuitry to be inoperable. Therefore, back-side power delivery as provided by back-side metallization layers 105 may be advantageous in the deployment of non-planar single MOS transistors 101.

In the illustrated example, front-side metallization layers 104 include M0, V0, M1, M2/V1, M3/V2, M4/V3, and M4-M12. However, front-side metallization layers 104 may include any number of metallization layers such as eight or more metallization layers. Similarly, back-side metallization layers 105 include BM0, BM1, BM2, and BM3. However, back-side metallization layers 105 may include any number of metallization layers such as two to five metallization layers. Front-side metallization layers 104 and back-side metallization layers 105 are embedded within dielectric materials 153, 154. Furthermore, optional metal-insulator-metal (MIM) devices such as diode devices may be provided within back-side metallization layers 105. Other devices such as capacitive memory devices may be provided within front-side metallization layers 104 and/or back-side metallization layers 105.

As discussed, IC system 100 includes IC die 102 and an active cooling structure operable to remove heat from IC die 102 to achieve a very low operating temperature of IC die 102. As used herein, the term very low operating temperature indicates a temperature at or below 0° C., although even lower temperatures such as an operating temperature at or below −50° C., an operating temperature at or below −70° C., an operating temperature at or below −100° C., an operating temperature at or below −180° C., or an operating temperature at or below −196° C. may be used. In some embodiments, the operating temperature is in a cryogenic temperature operating window (e.g., about −180° C. to about −70° C.). The active cooling structure may be provided as a package level structure (i.e., separable from IC die 102), as a die level structure (i.e., integral to IC die 102), or both. In some embodiments, an active cooling structure is not needed as IC die 102 is deployed in a sufficiently cold temperature environment. IC die 102 includes one or more functional circuit blocks such that one or all of the functional circuit blocks deploy only non-planar field effect transistors (FETs) of a single conductivity type. In some embodiments, the non-planar FETs are n-type FETs having n-type source and drain structures. In some embodiments, the non-planar FETs are p-type FETs having p-type source and drain structures. Any non-planar FETs may be implemented such as Fin FETs, gate all around FETs, nanosheet FETs, or floating Fin FETs.

Figure 2:
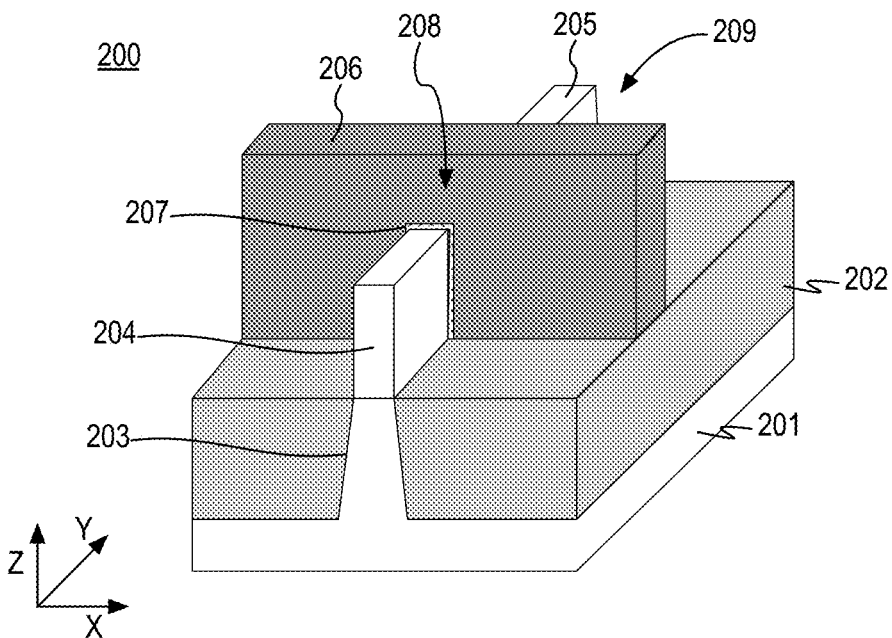
FIG. 2 illustrates an isometric view an example Fin FET for deployment as a non-planar transistor in the low temperature non-planar integrated circuit system of FIG. 1.

FIG. 2 illustrates an isometric view an example Fin FET 200 for deployment as a non-planar transistor in low temperature non-planar integrated circuit system 100, arranged in accordance with at least some implementations of the present disclosure. For example, Fin FETs 200 may be deployed as non-planar single MOS transistors 101. As shown, Fin FET 200 may be formed on or over a substrate 201 (all or of a portion of which may be subsequently removed in back-side metallization contexts). Substrate 201 may include any suitable material or materials. For example, substrate 201 may be a substrate substantially aligned along a predetermined crystal orientation (e.g., (100), (111), (110), or the like). In some examples, substrate 201 may include a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. In some examples, substrate 201 may include silicon having a (100) crystal orientation with a 4°-11° miscut (with 4°-6° being particularly advantageous). Examples using silicon having a crystal orientation of (110) or (111) may offer the advantage of having a smaller mismatch for subsequent epitaxial growth. For example, substrate 201 may be (111) silicon, (100) silicon, or (110) silicon. In an embodiment, substrate 201 includes a (111) crystalline group IV material.

As shown, a fin 209 and a sub-fin 203 (i.e., embedded in dielectric material 202) may be formed. In some embodiments, fin 209 and sub-fin 203 are formed of the substantially the same material as substrate 201 using any suitable technique or techniques such as patterning and etch techniques, for example, in some embodiments, fin 209 and sub-fin 203 are formed using epitaxial growth techniques or other growth techniques and fin 209 and sub-fin 203 may be the same or different material with respect to substrate 201.

For example, fin 209 and sub-fin 203 may include any material or material discussed with respect to substrate 201, although they need not be the same material.

Fin FET 200 further includes a gate structure (i.e., gate structures 112) including a gate dielectric 207 and a gate electrode 206. Gate electrode 206 may include one layer or a stack of layers. The one or more layers of gate dielectric 207 may include silicon oxide, silicon dioxide ($SiO_2$), and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in gate dielectric 207 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

Gate electrode 206 is on the gate dielectric layer and may include of at least one of a p-type work function metal or an n-type work function metal, depending on whether the transistor is a PMOS or an NMOS transistor. In some embodiments, gate electrode 206 is a stack of two or more metal layers, where one or more metal layers are work function metal layers and at least one metal layer is a fill metal layer. For a PMOS transistor, metals that may be used for the gate electrode include, but are not limited to, ruthenium, palladium, platinum, cobalt, nickel, and conductive metal oxides, e.g., ruthenium oxide. A p-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An n-type metal layer will enable the formation of an NMOS gate electrode with a work function that is between about 3.9 eV and about 4.2 eV.

Fin 209 of Fin FET 200 provides a channel region 208 (i.e., channel regions 111; obscured by gate dielectric 207 and gate electrode 206 in FIG. 2) that extends between a source structure 204 and a drain structure 205. Source structure 204 and a drain structure 205 may be the opposite conductivity type with respect to channel region 208, as discussed herein. For example, for NMOS transistors, source structure 204 and drain structure 205 are n-type materials and, for PMOS transistors, source structure 204 and drain structure 205 are p-type materials. In some embodiments, source structure 204 and drain structure 205 are semiconductor materials doped with the pertinent conductivity type dopants. For example, n-type dopants include phosphorous, arsenic, and antimony and p-type dopants include boron and gallium. In some embodiments, source structure 204 and drain structure 205 are formed from fin 209 (as shown). In other embodiments, a source structure and a drain structures may be epitaxially grown from channel region 208 (e.g., using etch and epitaxial growth processing) as is known in the art. In such embodiments, the source and drain structures are blocks (or faceted blocks) of material that do not match the shape of fin 209.

As discussed, channel region 208 (i.e., channel regions 111) is of a particular conductivity type (e.g., p-type or n-type) depending on the conductivity type and operational type of Fin FET 200. Similarly, source structure 204 and drain structure 205 are of a particular conductivity type (e.g., p-type or n-type) depending on the conductivity type of Fin FET 200. In the context of FIG. 1, non-planar single MOS transistors 101 may deploy any number of Fin FETs 200 such that all of such transistors are of the same conductivity type as discussed herein. For example, all of non-planar single MOS transistors 101 may be NMOS Fin FETs 200 (i.e., having n-type source structure 204 and drain structure 205) or all of non-planar single MOS transistors 101 may be PMOS Fin FETs 200 (i.e., having p-type source structure 204 and drain structure 205). Gate electrode 206 and source and drain structures 204, 205 may be contacted by a gate contact (i.e., gate contacts 113) and source and drain contacts (not shown) as known in the art.

Figure 3:
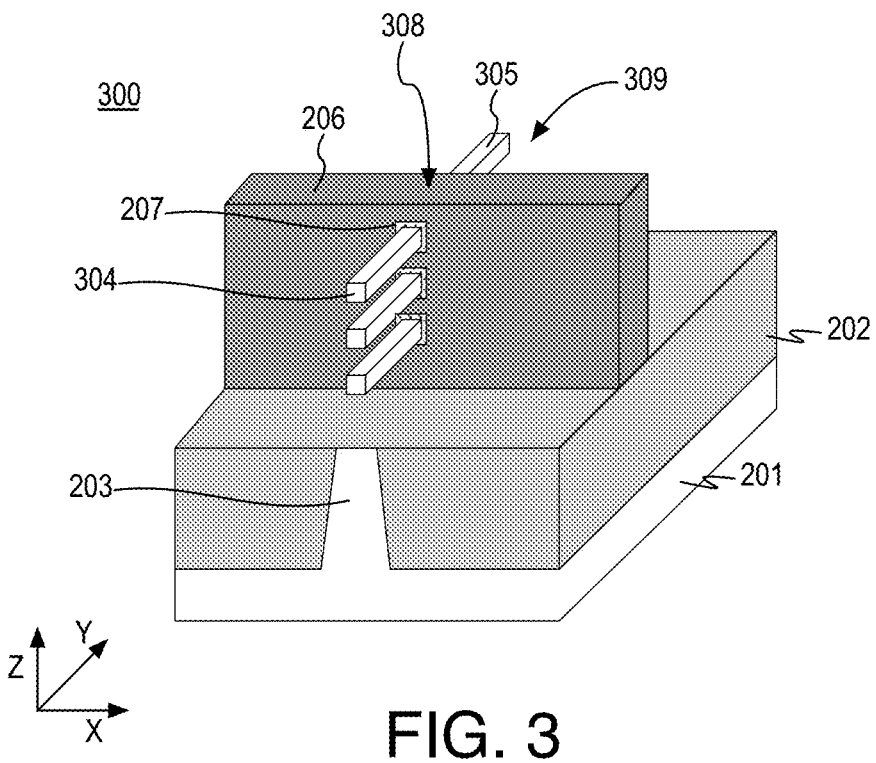
FIG. 3 illustrates an isometric view an example gate all around (GAA) FET for deployment as a non-planar transistor in the low temperature non-planar integrated circuit system of FIG. 1.

FIG. 3 illustrates an isometric view an example gate all around (GAA) FET 300 for deployment as a non-planar transistor in low temperature non-planar integrated circuit system 100, arranged in accordance with at least some implementations of the present disclosure. For example, GAA FETs 300 may be deployed as non-planar single MOS transistors 101. As shown, GAA FET 300 may be formed on or over substrate 201 (all or of a portion of which may be subsequently removed in back-side metallization contexts). Substrate 201 may include any material or materials discussed herein. As shown, nanoribbons or nanowires 309 may be formed, for example, by processing fin 209, as is known in the art. For example, nanowires 309 may be formed of the substantially the same material as substrate 201 using any suitable technique or techniques such as patterning and etch techniques, for example.

GAA FET 300 further includes a gate structure (i.e., gate structures 112) including gate dielectric 207 and gate electrode 206, which may include any material or materials discussed herein. Notably, gate dielectric 207 and gate electrode 206 surround channel regions 308 of each of nanowires 309. Nanowires 309 of GAA FET 300 provides channel regions 308 (i.e., channel regions 111; obscured in FIG. 3) that extend between source structures 304 and drain structures 305. Source structures 304 and a drain structures 305 may be the opposite conductivity type with respect to channel regions 308, as discussed herein. For example, for NMOS transistors, source structures 304 and drain structures 305 are n-type materials and, for PMOS transistors, source structures 304 and drain structures 305 are p-type materials. In some embodiments, source structures 304 and drain structures 305 are semiconductor materials doped with the pertinent conductivity type dopants. In some embodiments, source structures 304 and drain structures 305 are formed nanowires 309 (as shown). In other embodiments, a source structure and drain structure are epitaxially grown from channel regions 308. In such embodiments, the source and drain structures are blocks (or faceted blocks) of material that do not match the shape of nanoribbons or nanowires 309.

As discussed, channel regions 308 (i.e., channel regions 111) are of a particular conductivity type (e.g., p-type or n-type) depending on the conductivity type and operational type of GAA FET 300. Similarly, source structures 304 and drain structures 305 are of a particular conductivity type (e.g., p-type or n-type) depending on the conductivity type of GAA FET 300. In the context of FIG. 1, non-planar single MOS transistors 101 may deploy any number of GAA FETs 300 such that all of such transistors are of the same conductivity type.

Figure 4:
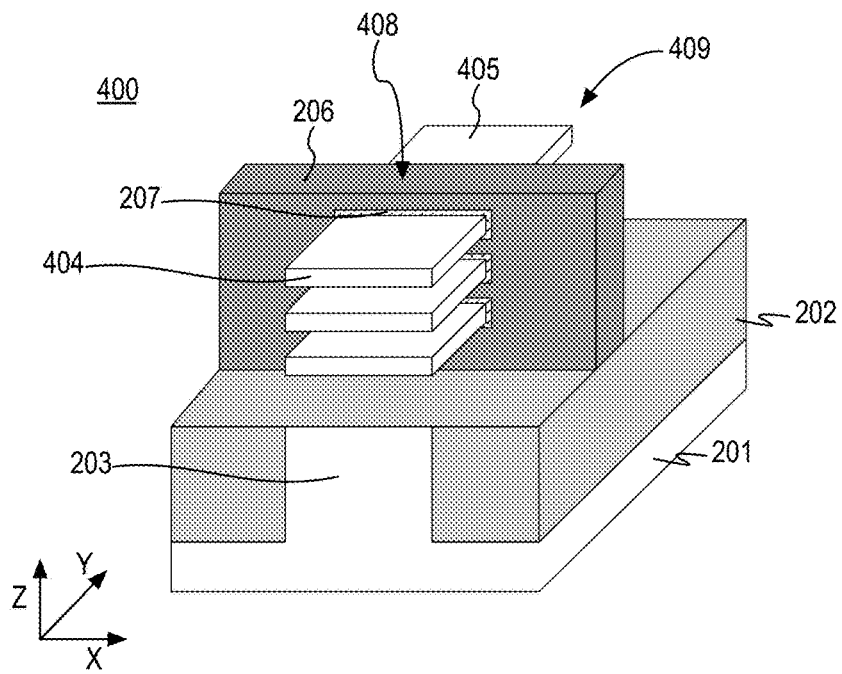
FIG. 4 illustrates an isometric view an example nanosheet FET for deployment as a non-planar transistor in the low temperature non-planar integrated circuit system of FIG. 1.

FIG. 4 illustrates an isometric view an example nanosheet FET 400 for deployment as a non-planar transistor in low temperature non-planar integrated circuit system 100, arranged in accordance with at least some implementations of the present disclosure. For example, nanosheet FETs 400 may be deployed as non-planar single MOS transistors 101. As shown, nanosheet FET 400 may be formed on or over substrate 201 (all or of a portion of which may be subsequently removed in back-side metallization contexts), which may include any material or materials discussed herein. As shown, nanosheets 409 may be formed, for example, by processing fin 209, as is known in the art. For example, nanosheets 409 may be formed of the substantially the same material as substrate 201 using any suitable technique or techniques such as patterning and etch techniques, for example.

Nanosheet FET 400 further includes a gate structure (i.e., gate structures 112) including gate dielectric 207 and gate electrode 206, which may include any material or materials discussed herein. Notably, gate dielectric 207 and gate electrode 206 surround channel regions 408 of each of nanosheets 409. Nanosheets 409 of nanosheet FET 400 provides channel regions 408 (i.e., channel regions 111; obscured in FIG. 3) that extend between source structures 404 and drain structures 405. Source structures 404 and drain structures 405 may be the opposite conductivity type with respect to channel regions 408, as discussed herein. For example, for NMOS transistors, source structures 404 and drain structures 405 are n-type materials and, for PMOS transistors, source structures 404 and drain structures 405 are p-type materials. In some embodiments, source structures 404 and drain structures 405 are semiconductor materials doped with the pertinent conductivity type dopants. In some embodiments, source structures 404 and drain structures 405 are formed from nanosheets 409 (as shown). In other embodiments, a source structure and a drain structure are epitaxially grown from channel regions 408. In such embodiments, the source and drain structures are blocks (or faceted blocks) of material that do not match the shape of nanosheets 409.

As discussed, channel regions 408 (i.e., channel regions 111) are of a particular conductivity type (e.g., p-type or n-type) depending on the conductivity type and operational type of nanosheet FET 400. Similarly, source structures 404 and drain structures 405 are of a particular conductivity type (e.g., p-type or n-type) depending on the conductivity type of nanosheet FET 400. In the context of FIG. 1, non-planar single MOS transistors 101 may deploy any number of nanosheet FETs 400 such that all of such transistors are of the same conductivity type.

Figure 5:
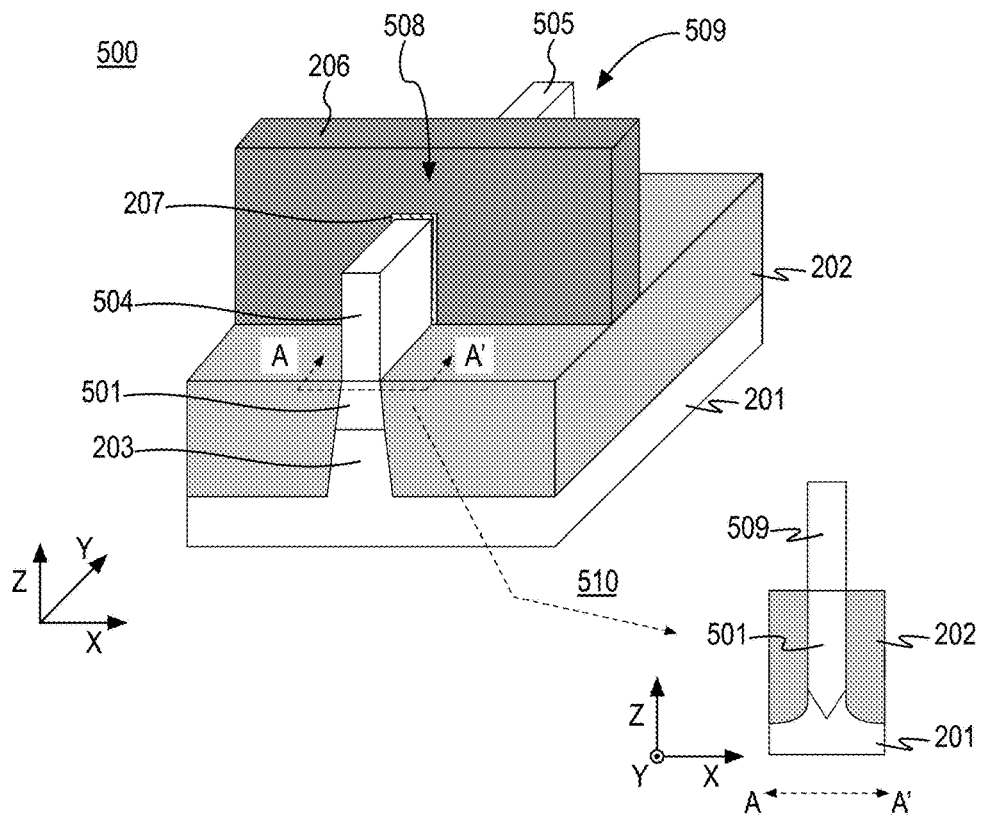
FIG. 5 illustrates an isometric view an example floating Fin FET for deployment as a non-planar transistor in the low temperature non-planar integrated circuit system of FIG. 1.

FIG. 5 illustrates an isometric view an example floating Fin FET 500 for deployment as a non-planar transistor in low temperature non-planar integrated circuit system 100, arranged in accordance with at least some implementations of the present disclosure. For example, floating Fin FETs 500 may be deployed as non-planar single MOS transistors 101. As shown, floating Fin FET 500 may be formed on or over substrate 201 (all or of a portion of which may be subsequently removed in back-side metallization contexts), which may include any material or materials discussed herein. As shown, a floating fin 509 (or partially floating fin) may be formed over a gap or void 501, for example, by removing at least a portion of sub-fin 203 using wet etch techniques. As shown in cross-sectional insert 510, floating fin 509 may be above void 501 such that void 501 is between portions of dielectric material 202 and substrate 201 (or sub-fin 203).

Floating Fin FET 500 further includes a gate structure (i.e., gate structures 112) including gate dielectric 207 and gate electrode 206, which may include any material or materials discussed herein. Floating fin 509 of floating Fin FET 500 provides channel region 508 (i.e., channel regions 111; obscured in FIG. 5) that extends between a source structure 504 and a drain structure 505. Source structure 504 and drain structure 505 may be the opposite conductivity type with respect to channel regions 508. For NMOS transistors, source structure 504 and drain structure 505 are n-type materials and, for PMOS transistors, source structure 504 and drain structure 505 are p-type materials. In some embodiments, source structure 504 and drain structure 505 are semiconductor materials doped with the pertinent conductivity type dopants. In some embodiments, source structure 504 and drain structure 505 are formed from floating fin 509 (as shown). In other embodiments, a source structure and a drain structure are epitaxially grown from channel region 508.

As discussed, channel regions 508 (i.e., channel regions 111) are of a particular conductivity type (e.g., p-type or n-type) depending on the conductivity type and operational type of floating Fin FET 500. Similarly, source structure 504 and drain structure 505 are of a particular conductivity type (e.g., p-type or n-type) depending on the conductivity type of floating Fin FET 500. In the context of FIG. 1, non-planar single MOS transistors 101 may deploy any number of floating Fin FETs 500 such that all of such transistors are of the same conductivity type.

As discussed, IC die 102 may include any number of functional circuit blocks that include transistors of only one conductivity type (i.e., single MOS transistors). In some embodiments, IC die 102 in its entirety includes transistors of only one conductivity type. Such functional circuit blocks may perform any suitable operations.

Figure 6:
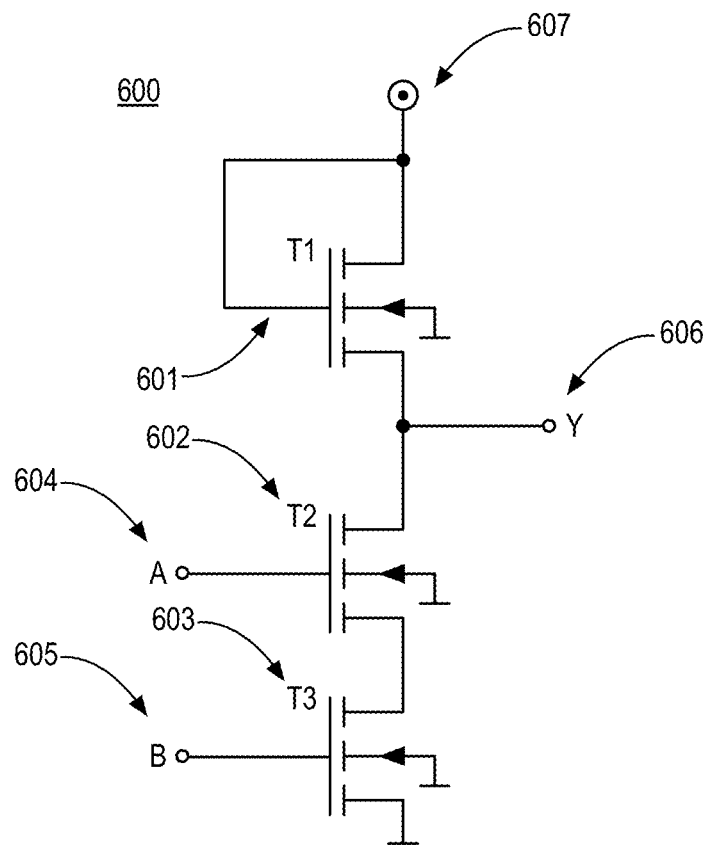
FIG. 6 illustrates a schematic diagram of an example NAND logic block including non-planar transistors all of the same conductivity type.

FIG. 6 illustrates a schematic diagram of an example NAND logic block 600 including non-planar transistors all of the same conductivity type, arranged in accordance with at least some implementations of the present disclosure. As shown, NAND logic block 600 includes three transistors 601, 602, 603 (also labeled T1, T2, T3), each including a gate electrode, which are coupled to input node 607, logical input 604 (also labeled A), and logical input 605 (also labeled B). Also, as shown, NAND logic block 600 provides a logical output 606 (also labeled Y). Notably, NAND logic block 600 provides a false output on logical output 606 only if each of logical inputs 604, 605 are true.

Furthermore, as discussed herein, each of transistors 601, 602, 603 are all of the same conductivity type and NAND logic block 600 is deployed at a very low operating temperature. In some embodiments, each of transistors 601, 602, 603 is an NMOS transistor (i.e., having n-type source and drain structures). In some embodiments, each of transistors 601, 602, 603 is a PMOS transistor (i.e., having p-type source and drain structures). The very low operating temperature may be provided using any structures or techniques discussed herein. Notably, NAND logic block 600 may be deployed as a functional circuit block of IC die 102.

Figure 7:
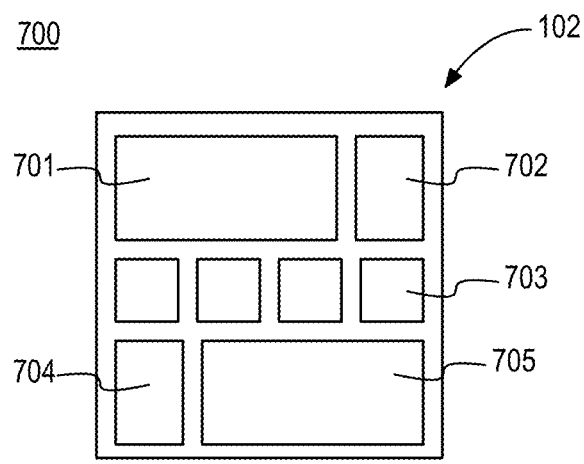
FIG. 7 illustrates a schematic diagram of an functional circuit block layout including non-planar transistors all of the same conductivity type.

FIG. 7 illustrates a schematic diagram of an functional circuit block layout 700 including non-planar transistors all of the same conductivity type, arranged in accordance with at least some implementations of the present disclosure. As shown, IC die 102 may include a number of functional circuit blocks 701, 702, 703, 704, 705 such that non-planar transistors only of a single conductivity type (i.e., single MOS transistors) are deployed in each of functional circuit blocks 701, 702, 703, 704, 705. In some embodiments, all of functional circuit blocks 701, 702, 703, 704, 705 implement non-planar transistors only of a single conductivity type. That is, IC die 102 may include non-planar transistors only of a single conductivity type. For example, IC die 102 may not implement any CMOS circuitry. In some embodiments, IC die 102 has only non-planar transistors of a single conductivity. In some embodiments, the transistors of IC die 102 are all non-planar NMOS transistors.

Functional circuit blocks 701, 702, 703, 704, 705 of IC die 102 may provide any functionality. In some embodiments, one or more of functional circuit blocks 701, 702, 703, 704, 705 provide a processor core for IC die 102. In some embodiments, one or more of functional circuit blocks 701, 702, 703, 704, 705 provide a controller device for IC die 102. In some embodiments, one or more of functional circuit blocks 701, 702, 703, 704, 705 provide a programmable logic device for IC die 102. In some embodiments, one or more of functional circuit blocks 701, 702, 703, 704, 705 provide a field programmable gate array for IC die 102.

Each of functional circuit blocks 701, 702, 703, 704, 705 may include any number of non-planar transistors of the same conductivity type. In some embodiments, one or more of functional circuit blocks 701, 702, 703, 704, 705 include not fewer than 10,000 non-planar transistors of the same conductivity type (i.e., single MOS transistors). In some embodiments, one or more of functional circuit blocks 701, 702, 703, 704, 705 include not fewer than 100,000 non-planar transistors of the same conductivity type (i.e., single MOS transistors). In some embodiments, one or more of functional circuit blocks 701, 702, 703, 704, 705 include not fewer than $1 \times 10^6$ non-planar transistors of the same conductivity type (i.e., single MOS transistors). In some embodiments, one or more of functional circuit blocks 701, 702, 703, 704, 705 include not fewer than $1 \times 10^7$ non-planar transistors of the same conductivity type (i.e., single MOS transistors).

As discussed, low temperature non-planar transistor integrated circuit system 100 is operable at a very low temperature as provided by environmental conditions and/or an active cooling structure. The active cooling structure may include any number of components or devices to remove heat from IC die 102 to achieve a very low operating temperature as discussed herein.

Figure 8:
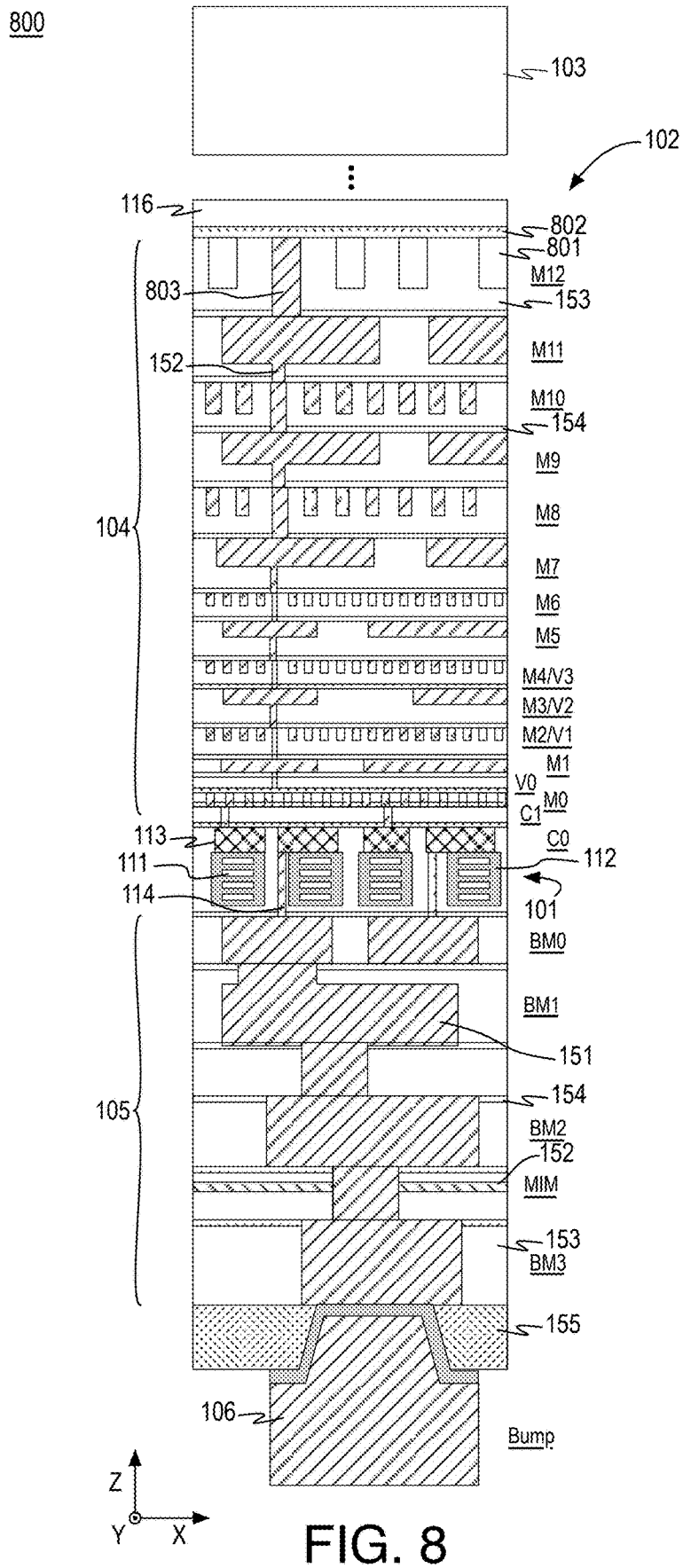
FIG. 8 illustrates a cross-sectional view of a low temperature non-planar transistor integrated circuit system using die level cooling.

FIG. 8 illustrates a cross-sectional view of a low temperature non-planar transistor integrated circuit system 800 using die level cooling, arranged in accordance with at least some implementations of the present disclosure. In FIG. 8 and elsewhere herein, like numerals are used to indicate like structures or components that may have any characteristics discussed elsewhere herein. In the example of IC system 800, IC die 102 includes active cooling structures or components to remove heat from IC die 102 to achieve an operating temperature of IC die 102 at or below a target temperature such as 0° C. or any other operating or target temperature discussed herein.

In IC system 800, IC die 102 includes die level active cooling as provided by microchannels 801. Microchannels 801 are to convey a heat transfer fluid therein to remove heat from IC die 102. The heat transfer fluid may be any suitable liquid or gas. In some embodiments, the heat transfer fluid is liquid nitrogen operable to lower the temperature of IC die to a temperature at or below about −196° C. In some embodiments, the heat transfer fluid is a fluid with a cryogenic temperature operating window (e.g., about −180° C. to about −70° C.). In some embodiments, the heat transfer fluid is one of helium-3, helium-4, hydrogen, neon, air, fluorine, argon, oxygen, or methane.

As used herein, the term microchannels indicates a channel to convey a heat transfer fluid with the multiple microchannels providing discrete separate channels or a network of channels. Notably, the plural microchannels does not indicate separate channel networks are needed. Such microchannels 801 may be provided in any pattern in the x-y plane such as serpentine patterns, patterns of multiple parallel microchannels 801, or the like. Microchannels 801 couple to a heat exchanger (not shown) that removes heat from and cools the heat transfer fluid before re-introduction to microchannels 801. The flow of fluid within microchannels 801 may be provided by a pump or other fluid flow device. The operation of the heat exchanger, pump, etc. may be controlled by a controller.

In the illustrated embodiment, microchannels 801 are implemented at metallization level M12. In other embodiments, microchannels 801 are implemented over metallization level M12. Microchannels 801 may be formed using any suitable technique or techniques such as patterning and etch techniques to form the void structures of microchannels 801 and passivation or deposition techniques to form a cover structure 802 to enclose the void structures. As shown, in some embodiments, the active cooling structure of IC system 800 includes a number of microchannels 801 in IC die 102 and over a number of front-side metallization layers 104. As discussed, microchannels 801 are to convey a heat transfer fluid therein.

In some embodiments, a metallization feature 803 of metallization layer M12 is laterally adjacent to microchannels 801. For example, metallization feature 803 may couple to a package level interconnect structure (not shown) for signal routing for IC die 102. In the example of IC system 800, package level cooling structure 103 may be a passive heat removal device such as a heat sink or the like. In some embodiments, package level cooling structure 103 is not deployed in IC system 800.

Figure 9:
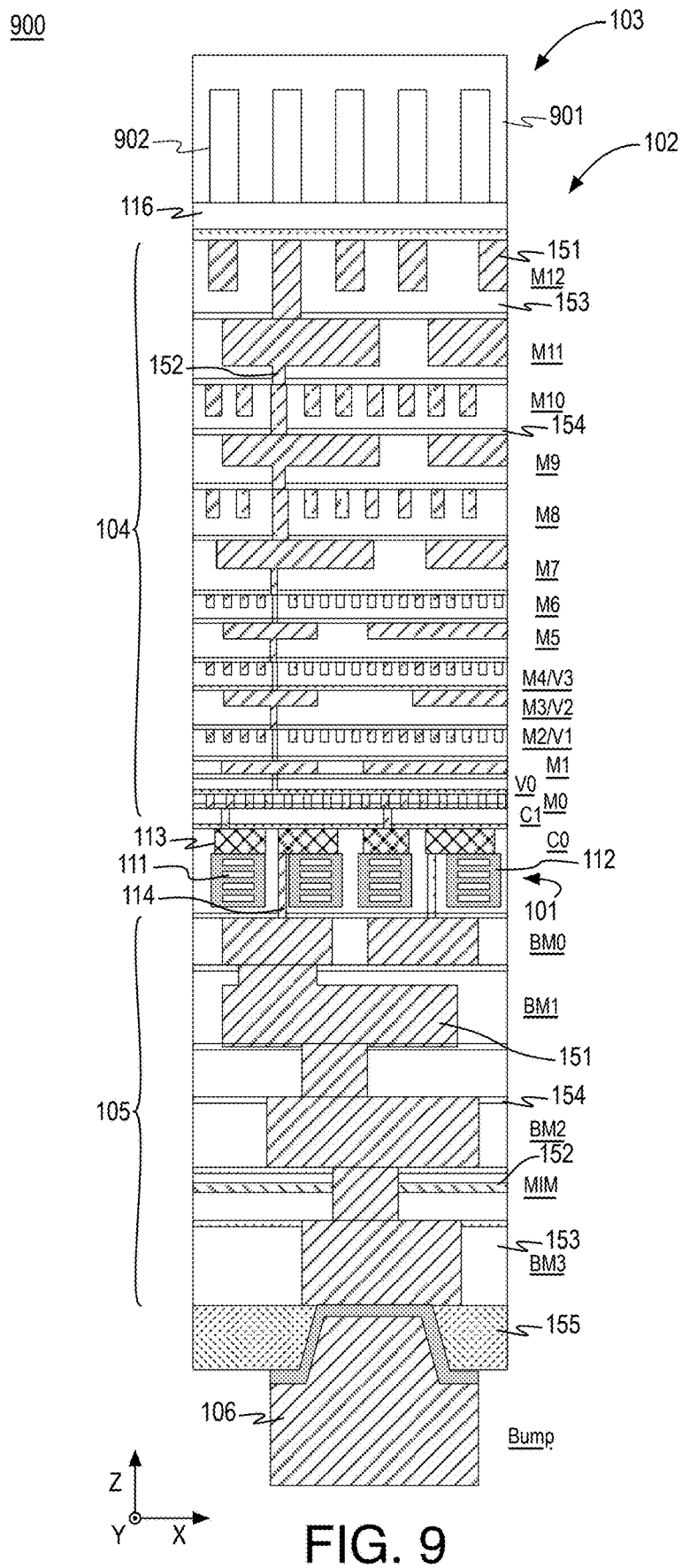
FIG. 9 illustrates a cross-sectional view of a low temperature non-planar transistor integrated circuit system using package level cooling.

FIG. 9 illustrates a cross-sectional view of a low temperature non-planar transistor integrated circuit system 900 using package level cooling, arranged in accordance with at least some implementations of the present disclosure. In the example of IC system 900, package level cooling structure 103 includes active cooling structures or components to remove heat from IC die 102 to achieve an operating temperature of IC die 102 at or below a target temperature such as 0° C. or any other operating or target temperature discussed herein.

In IC system 900, package level cooling structure 103 includes an active cooling structure 901 having microchannels 902. Microchannels 902 are to convey a heat transfer fluid therein to remove heat from IC die 102. The heat transfer fluid may be any suitable liquid or gas as discussed with respect to FIG. 8. Microchannels 902 may be provided in any pattern in the x-y plane such as serpentine patterns, patterns of multiple parallel microchannels 902, etc. Microchannels 902 couple to a heat exchanger (not shown) that removes heat from and cools the heat transfer fluid before re-introduction to microchannels 902. The flow of fluid within microchannels 902 may be provided by a pump or other fluid flow device. The operation of the heat exchanger, pump, etc. may be controlled by a controller. In the illustrated embodiment, active cooling structure 901 is a chiller mounted to IC die 102 such that the chiller has a solid body having microchannels therein to convey a heat transfer fluid.

Figure 10:
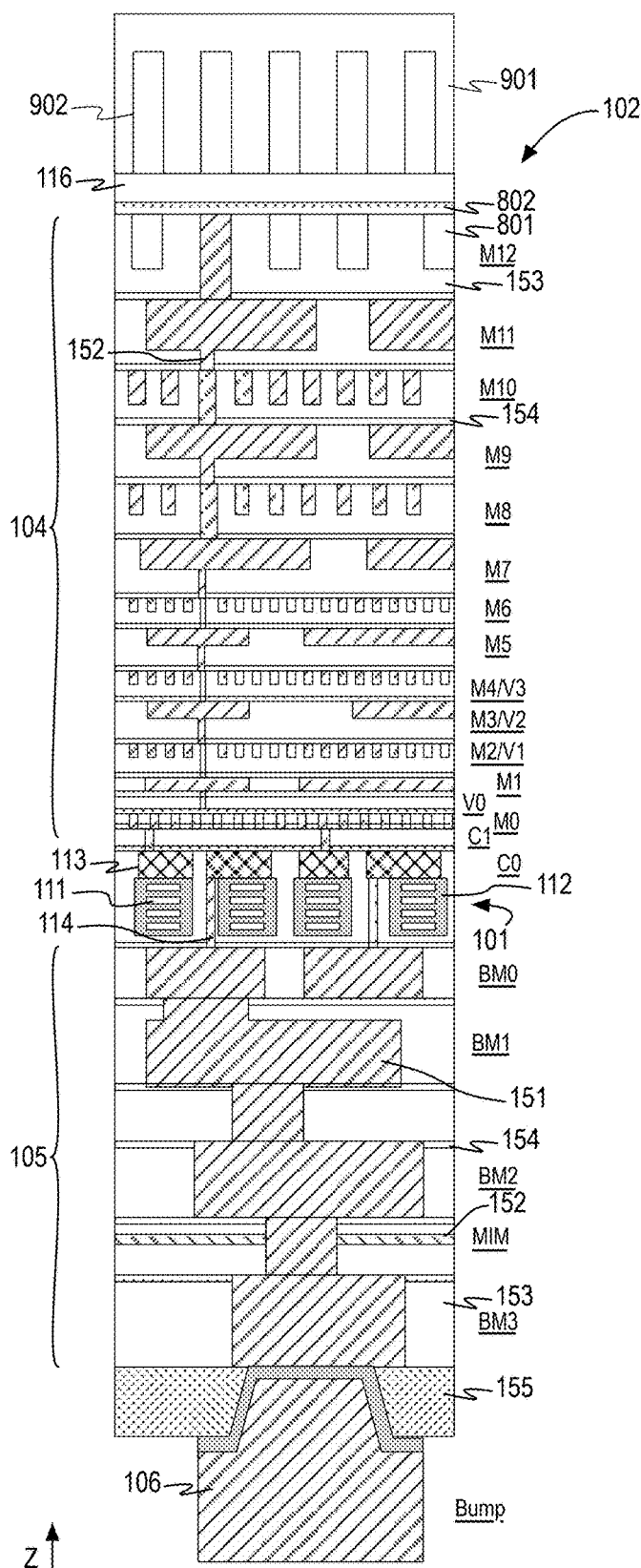
FIG. 10 illustrates a cross-sectional view of a low temperature non-planar transistor integrated circuit system using die level and package level cooling.

FIG. 10 illustrates a cross-sectional view of a low temperature non-planar transistor integrated circuit system 1000 using die level and package level cooling, arranged in accordance with at least some implementations of the present disclosure. In the example of IC system 1000, IC die 102 includes active cooling structures or components as provided by both microchannels 801 and active cooling structure 901.

In some embodiments, the heat removal fluid deployed in microchannels 801 and active cooling structure 901 are coupled to the same pump and heat exchanger systems. In such embodiments, the heat removal fluid conveyed in both microchannels 801 and active cooling structure 901 are the same material. Such embodiments may advantageously provide simplicity. In other embodiments, the heat removal fluids are controlled separately. In such embodiments, the heat removal fluids conveyed by microchannels 801 and active cooling structure 901 may be the same or they may be different. Such embodiments may advantageously provide improved flexibility.

Figure 11:
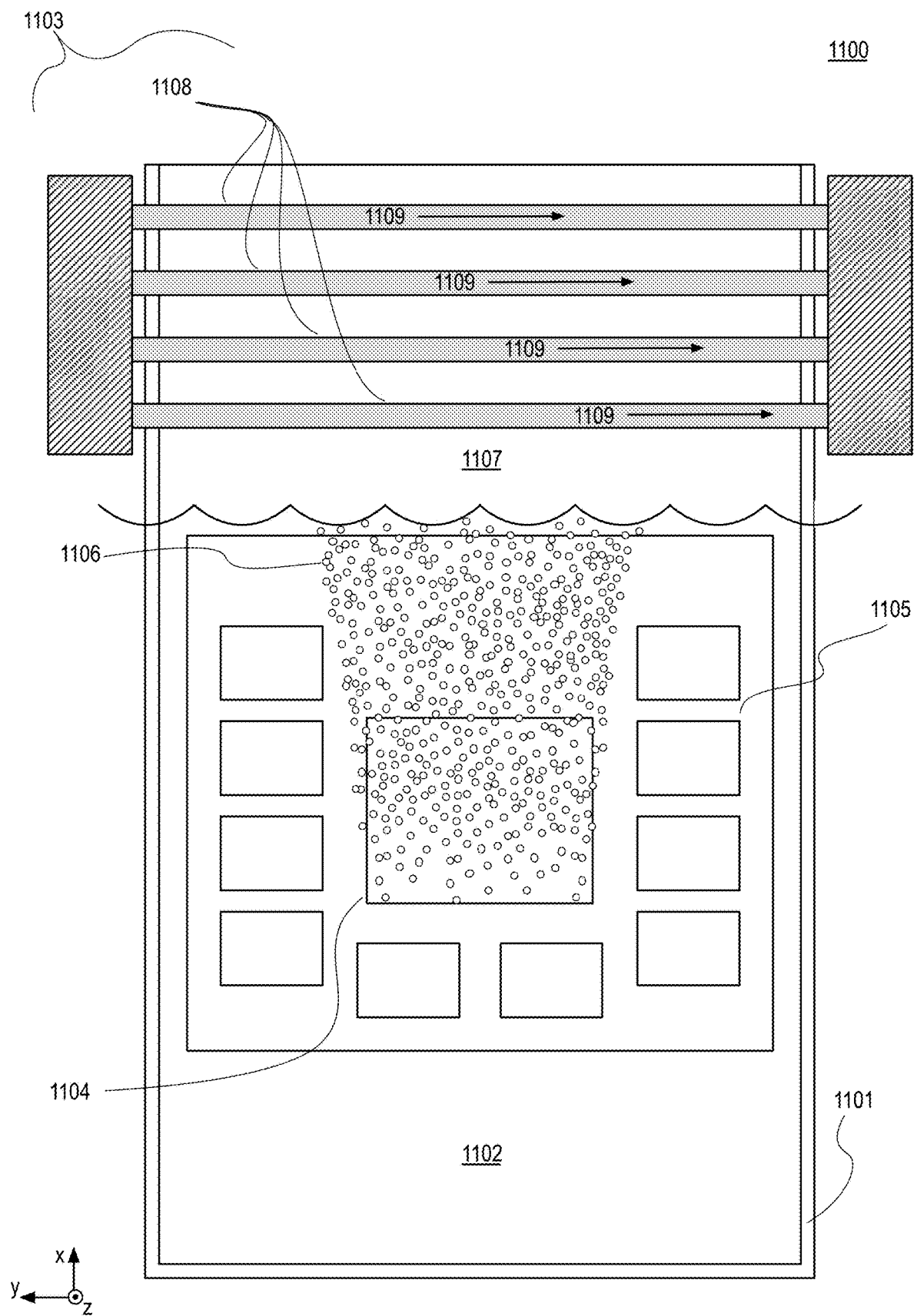
FIG. 11 illustrates a view of an example two-phase immersion cooling system for low temperature operation of an integrated circuit die having non-planar transistors all of the same conductivity type.

FIG. 11 illustrates a view of an example two-phase immersion cooling system 1100 for low temperature operation of an integrated circuit die having non-planar transistors all of the same conductivity type, arranged in accordance with at least some implementations of the present disclosure. As shown, two-phase immersion cooling system 1100 includes a fluid containment structure 1101, a low-boiling point liquid 1102 within fluid containment structure 1101, and a condensation structure 1103 at least partially within fluid containment structure 1101. As used herein, the term low-boiling point liquid indicates a liquid having a boiling point in the very low temperature ranges discussed. In some embodiments, the low-boiling point liquid is one of helium-3, helium-4, hydrogen, neon, air, fluorine, argon, oxygen, or methane.

In operation, a heat generation source 1104, such as an IC package including any of IC systems 100, 800 900, 1000 as discussed herein is immersed in low-boiling point liquid 1102. In some embodiments, IC systems 100, 800 900, 1000 as deployed in two-phase immersion cooling system 1100 do not include additional active cooling structures, although such die level or package level active cooling structures may be used in concert with two-phase immersion cooling system 1100. In some embodiments, when deployed in two-phase immersion cooling system 1100, package level cooling structure 103 is a heat sink, a heat dissipation plate, a porous heat dissipation plate or the like.

Notably, IC die 102, deploying one or more functional circuit blocks having non-planar transistors all of a single conductivity type is the source of heat in the context of two-phase immersion cooling system 1100. For example, IC die 102 may be packaged and mounted on electronics substrate 1105. Electronic substrate 1105 may be coupled to a power supply (not shown) and may be partially or completely submerged in low-boiling point liquid 1102.

In operation, the heat produced by heat generation source 1104 vaporizes low-boiling point liquid 1102 as shown in vapor or gas state as bubbles 1106, which may collect, due to gravitational forces, above low-boiling point liquid 1102 as a vapor portion 1107 within fluid containment structure 1101. Condensation structure 1103 may extend through vapor portion 1107. In some embodiments, condensation structure 1103 is a heat exchanger having a number of tubes 1108 with a cooling fluid (i.e., a fluid colder than the condensation point of vapor portion 1107) shown by arrows 1109 that may flow through tubes 1108 to condense vapor portion 1107 back to low-boiling point liquid 1102. In the IC system of FIG. 11, package level cooling structure 103 includes a passive cooling structure such as a heat sink for immersion in low-boiling point liquid 1102.

Figure 12:
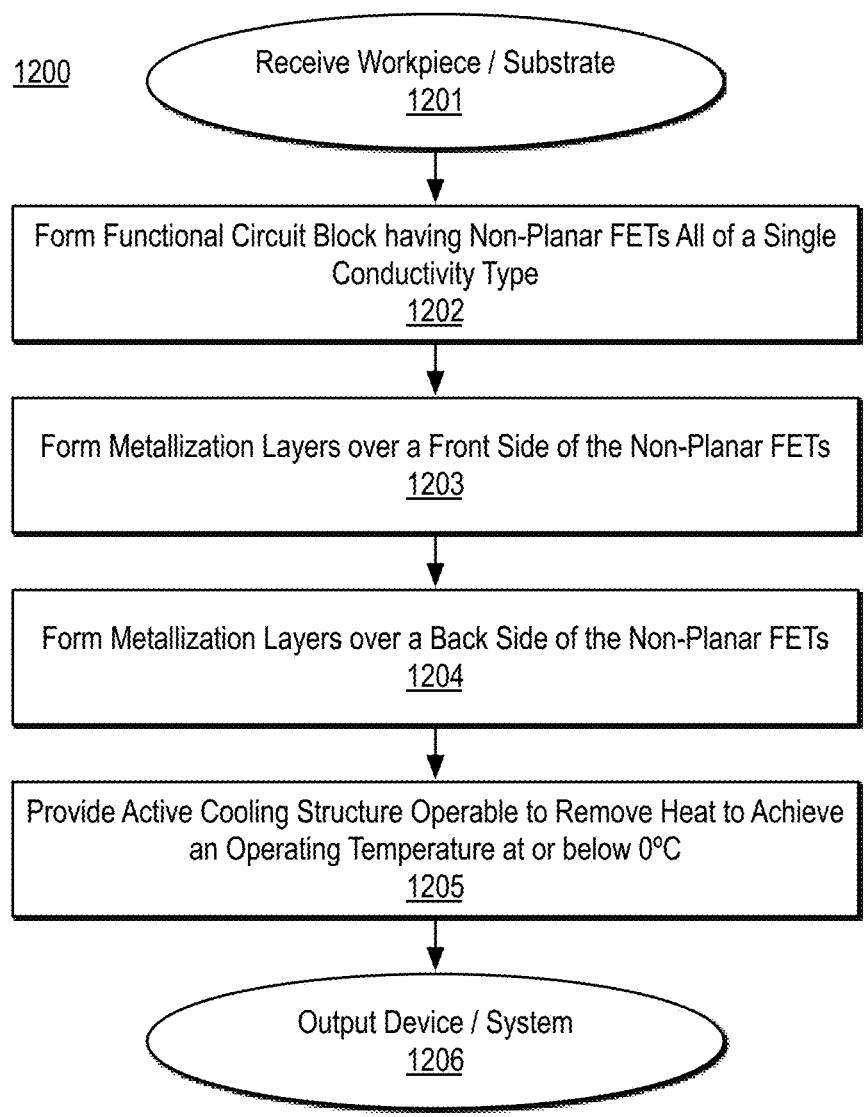
FIG. 12 is a flow diagram illustrating an example process for forming a low temperature non-planar transistor integrated circuit system.

FIG. 12 is a flow diagram illustrating an example process 1200 for forming a low temperature non-planar transistor integrated circuit system, arranged in accordance with at least some implementations of the present disclosure. As shown, process 1200 begins at operation 1201, where a workpiece or substrate is received for processing. The substrate may be any substrate discussed herein such as those discussed with respect to FIG. 1. In some embodiments, the substrate is a wafer.

Processing continues at operation 1202, where a functional circuit block is formed over the substrate such that the functional circuit block includes a number of non-planar field effect transistors all of a single conductivity type. The non-planar FETs may be NMOS or PMOS FETs as discussed herein. Such functional circuit blocks may be formed using any suitable technique or techniques such as patterning techniques, etch techniques, deposition techniques, implant techniques, planarization techniques, and so on as known in the art. For example, non-planar single MOS transistors 101 may be formed at operation 1202.

Processing continues at operation 1203, where a number of metallization layers are formed over a front side of the non-planar FETs. In some embodiments, the metallization layers are to provide signal routing for the non-planar FETs. The front-side metallization layers may be formed using any suitable technique or techniques such as dual damascene techniques, single damascene techniques, subtractive metallization patterning techniques, or the like. For example, front-side metallization layers 104 may be formed at operation 1203.

Processing continues at operation 1204, where a number of metallization layers are formed over a back side of the non-planar FETs. In some embodiments, the metallization layers are to provide power delivery for the non-planar FETs. The back-side metallization layers may be formed using any suitable technique or techniques. In some embodiments, after front-side processing, the front-side of the wafer is attached to a carrier substrate and back side removal processing (e.g., back-side grind or etch) is used to thin the wafer. The non-planar FETs may then be contacted from the back side using through via contacts. The back-side metallization layers are then formed using dual damascene, single damascene, subtractive metallization patterning, etc. For example, back-side metallization layers 105 may be formed at operation 1204.

Processing continues at operation 1205, where an active cooling structure operable to remove heat from the functional circuit block to achieve an operating temperature at or below 0° C. is provided. Any active cooling structure discussed herein may be provided at operation. Notably, in the context of die level active cooling operation 1205 may precede operation 1204 as the die level active cooling may be formed on the front-side over the front-side metallization layers formed at operation 1203. As discussed, such die level active cooling may be formed by etching the void structures of the microchannels followed by deposition techniques to enclose the void structures. For example, microchannels 801 to convey a heat transfer fluid therein may be formed at operation 1205.

In addition or in the alternative, a package level active cooling structure is provided. In some embodiments, active cooling structure 901 having microchannels 902 may be separately formed and attached to an IC die separated from the wafer received at operation 1201. For example, the wafer may be diced, each IC die may be packaged and an active cooling structure 901 may be attached thereto. In some embodiments, a two-phase immersion cooling system as discussed with respect to FIG. 11 is provided as the package level active cooling structure.

Processing continues at operation 1206, where the resultant device or system is output for use. As discussed, the active cooling structure is operable to maintain a very low temperature for the IC die, and the IC die deploys single MOS circuitry for improved device performance.

Figure 13:
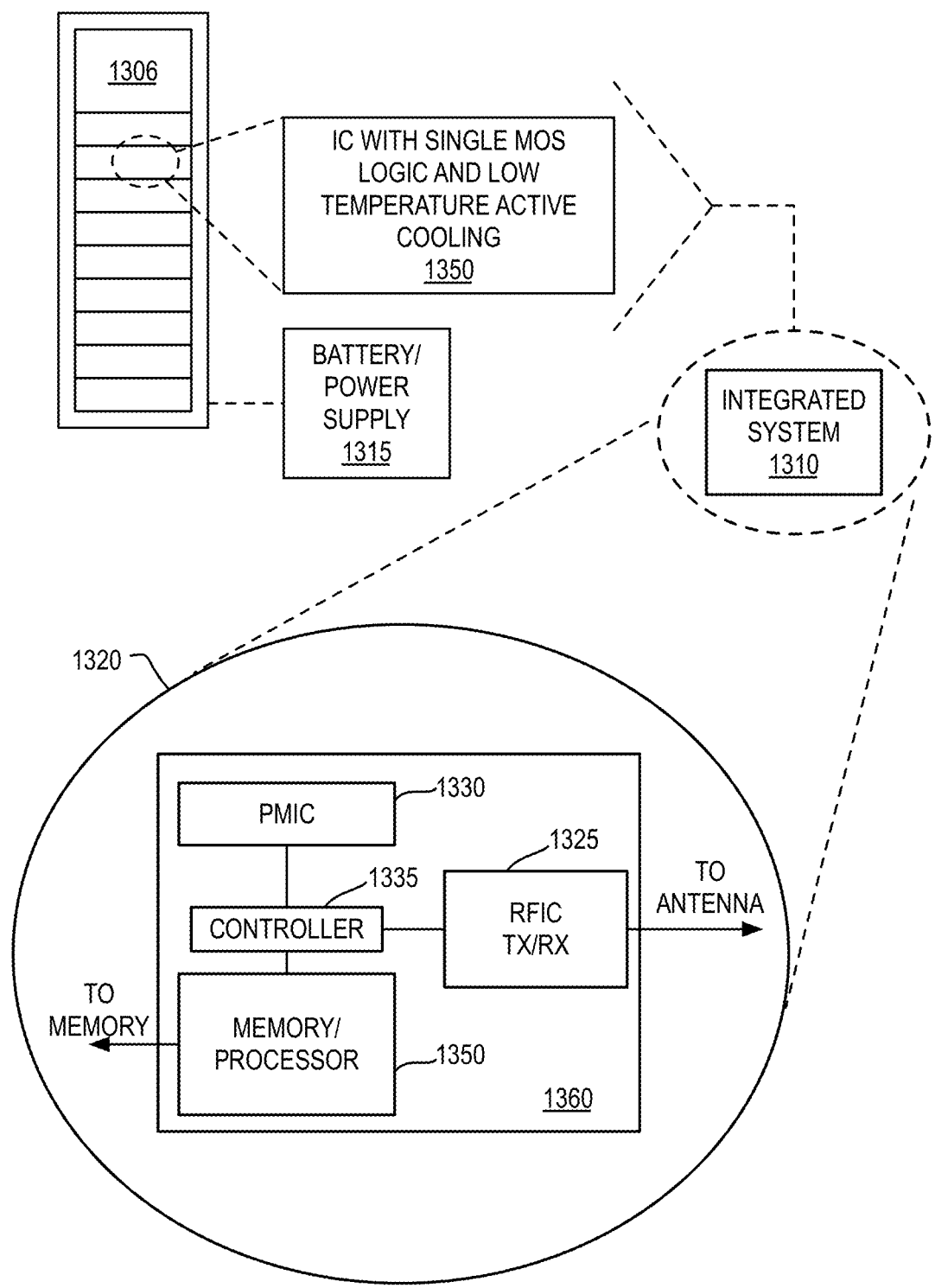
FIG. 13 illustrates diagram of an example data server machine employing a low temperature non-planar transistor integrated circuit system.

FIG. 13 illustrates diagram of an example data server machine 1306 employing a low temperature non-planar transistor integrated circuit system, arranged in accordance with at least some implementations of the present disclosure. Server machine 1306 may be any commercial server, for example, including any number of high-performance computing platforms disposed within a rack and networked together for electronic data processing, which in the exemplary embodiment includes one or more devices 1350 having an integrated circuit with functional circuit blocks having a number of non-planar transistors all of a single conductivity type and low temperature active cooling operable to remove heat from the integrated circuit to achieve any low operating temperature discussed herein.

Also as shown, server machine 1306 includes a battery and/or power supply 1315 to provide power to devices 1350, and to provide, in some embodiments power delivery functions such as power regulation. Devices 1350 may be deployed as part of a package-level integrated system 1310. Integrated system 1310 is further illustrated in the expanded view 1320. In the exemplary embodiment, devices 1350 (labeled "Memory/Processor") includes at least one memory chip (e.g., RAM), and/or at least one processor chip (e.g., a microprocessor, a multi-core microprocessor, or graphics processor, or the like) having the characteristics discussed herein. In an embodiment, device 1350 is a microprocessor including an SRAM cache memory. As shown, device 1350 may employ a die or device having any transistor structures and/or related characteristics discussed herein. Device 1350 may be further coupled to (e.g., communicatively coupled to) a board, a substrate, or an interposer 1360 along with, one or more of a power management integrated circuit (PMIC) 1330, RF (wireless) integrated circuit (RFIC) 1325 including a wideband RF (wireless) transmitter and/or receiver (TX/RX) (e.g., including a digital baseband and an analog front end module further comprises a power amplifier on a transmit path and a low noise amplifier on a receive path), and a controller 1335 thereof.

Figure 14:
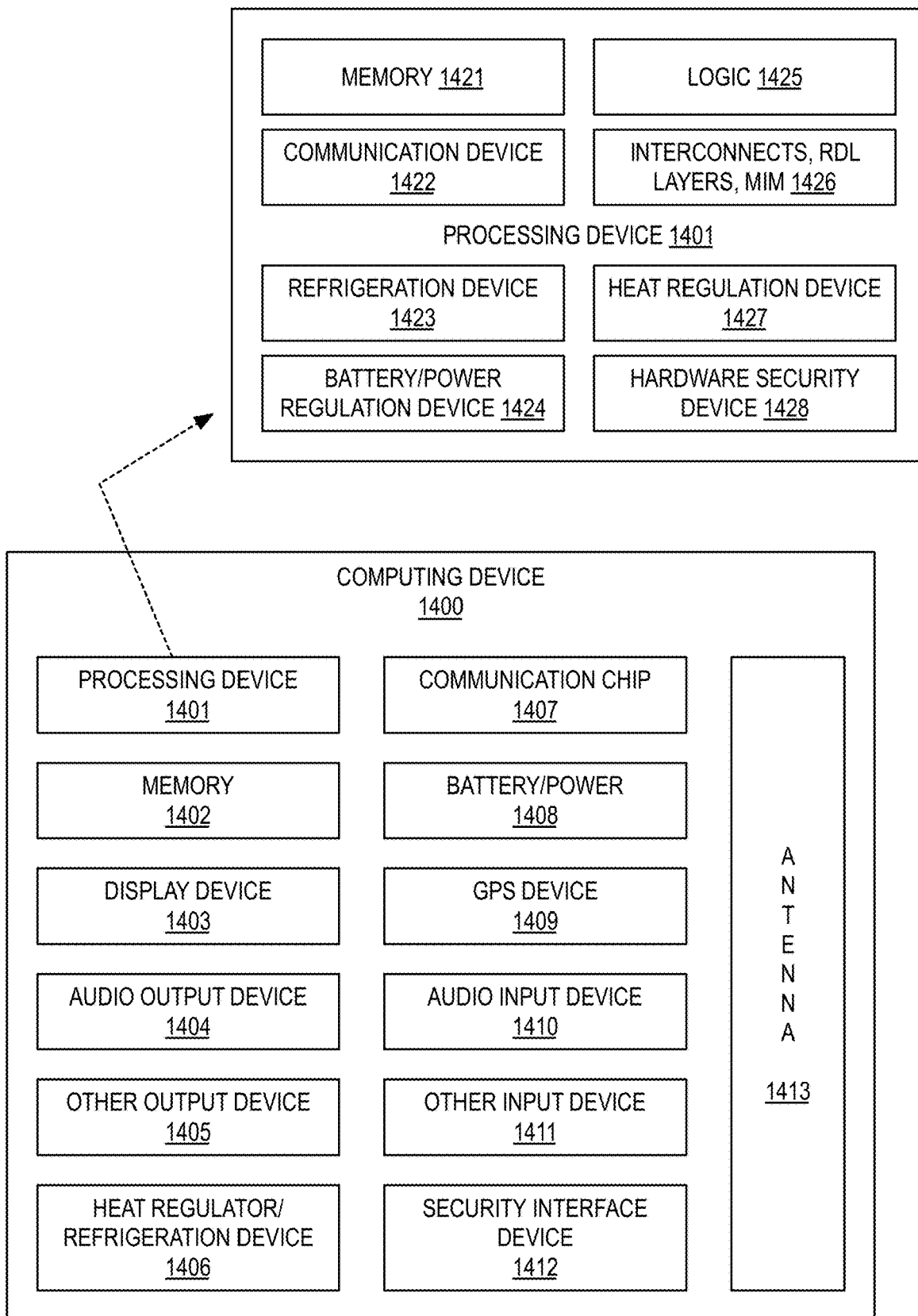
FIG. 14 is a block diagram of an example computing device, all arranged in accordance with at least some implementations of the present disclosure.

FIG. 14 is a block diagram of an example computing device 1400, arranged in accordance with at least some implementations of the present disclosure. For example, one or more components of computing device 1400 that may include any of the devices or structures discussed herein. A number of components are illustrated in FIG. 14 as included in computing device 1400, but any one or more of these components may be omitted or duplicated, as suitable for the application. In some embodiments, some or all of the components included in computing device 1400 may be attached to one or more printed circuit boards (e.g., a motherboard). In some embodiments, various ones of these components may be fabricated onto a single system-on-a-chip (SoC) die. Additionally, in various embodiments, computing device 1400 may not include one or more of the components illustrated in FIG. 14, but computing device 1400 may include interface circuitry for coupling to the one or more components. For example, computing device 1400 may not include a display device 1403, but may include display device interface circuitry (e.g., a connector and driver circuitry) to which display device 1403 may be coupled. In another set of examples, computing device 1400 may not include an audio output device 1404, other output device 1405, global positioning system (GPS) device 1409, audio input device 1410, or other input device 1411, but may include audio output device interface circuitry, other output device interface circuitry, GPS device interface circuitry, audio input device interface circuitry, audio input device interface circuitry, to which audio output device 1404, other output device 1405, GPS device 1409, audio input device 1410, or other input device 1411 may be coupled.

Computing device 1400 may include a processing device 1401 (e.g., one or more processing devices). As used herein, the term processing device or processor indicates a device that processes electronic data from registers and/or memory to transform that electronic data into other electronic data that may be stored in registers and/or memory. Processing device 1401 may include a memory 1421, a communication device 1422, a refrigeration device 1423, a battery/power regulation device 1424, logic 1425, interconnects 1426 (i.e., optionally including redistribution layers (RDL) or metal-insulator-metal (MIM) devices), a heat regulation device 1427, and a hardware security device 1428.

Processing device 1401 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Computing device 1400 may include a memory 1402, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 1402 includes memory that shares a die with processing device 1401. This memory may be used as cache memory and may include embedded dynamic random access memory (eDRAM) or spin transfer torque magnetic random-access memory (STT-M RAM).

Computing device 1400 may include a heat regulation/refrigeration device 1406. Heat regulation/refrigeration device 1406 may maintain processing device 1401 (and/or other components of computing device 1400) at a predetermined low temperature during operation. This predetermined low temperature may be any temperature discussed herein.

In some embodiments, computing device 1400 may include a communication chip 1407 (e.g., one or more communication chips). For example, the communication chip 1407 may be configured for managing wireless communications for the transfer of data to and from computing device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 1407 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1407 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1407 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1407 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1407 may operate in accordance with other wireless protocols in other embodiments. Computing device 1400 may include an antenna 1413 to facilitate wireless communications and/or to receive other wireless communications (such as AM or FM radio transmissions).

In some embodiments, communication chip 1407 may manage wired communications, such as electrical, optical, or any other suitable communication protocols (e.g., the Ethernet). As noted above, communication chip 1407 may include multiple communication chips. For instance, a first communication chip 1407 may be dedicated to shorter-range wireless communications such as Wi-Fi or Bluetooth, and a second communication chip 1407 may be dedicated to longer-range wireless communications such as GPS, EDGE, GPRS, CDMA, WiMAX, LTE, EV-DO, or others. In some embodiments, a first communication chip 1407 may be dedicated to wireless communications, and a second communication chip 1407 may be dedicated to wired communications.

Computing device 1400 may include battery/power circuitry 1408. Battery/power circuitry 1408 may include one or more energy storage devices (e.g., batteries or capacitors) and/or circuitry for coupling components of computing device 1400 to an energy source separate from computing device 1400 (e.g., AC line power).

Computing device 1400 may include a display device 1403 (or corresponding interface circuitry, as discussed above). Display device 1403 may include any visual indicators, such as a heads-up display, a computer monitor, a projector, a touchscreen display, a liquid crystal display (LCD), a light-emitting diode display, or a flat panel display, for example.

Computing device 1400 may include an audio output device 1404 (or corresponding interface circuitry, as discussed above). Audio output device 1404 may include any device that generates an audible indicator, such as speakers, headsets, or earbuds, for example.

Computing device 1400 may include an audio input device 1410 (or corresponding interface circuitry, as discussed above). Audio input device 1410 may include any device that generates a signal representative of a sound, such as microphones, microphone arrays, or digital instruments (e.g., instruments having a musical instrument digital interface (MIDI) output).

Computing device 1400 may include a global positioning system (GPS) device 1409 (or corresponding interface circuitry, as discussed above). GPS device 1409 may be in communication with a satellite-based system and may receive a location of computing device 1400, as known in the art.

Computing device 1400 may include other output device 1405 (or corresponding interface circuitry, as discussed above). Examples of the other output device 1405 may include an audio codec, a video codec, a printer, a wired or wireless transmitter for providing information to other devices, or an additional storage device.

Computing device 1400 may include other input device 1411 (or corresponding interface circuitry, as discussed above). Examples of the other input device 1411 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1400 may include a security interface device 1412. Security interface device 1412 may include any device that provides security measures for computing device 1400 such as intrusion detection, biometric validation, security encode or decode, access list management, malware detection, or spyware detection, Computing device 1400, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following embodiments pertain to further embodiments.

In one or more first embodiments, an apparatus comprises an integrated circuit (IC) die comprising one or more functional circuit blocks, wherein a first of the functional circuit blocks consists of a plurality of non-planar field effect transistors (FETs) all of a single conductivity type, and a cooling structure operable to remove heat from the IC die to achieve an operating temperature at or below −25° C.

In one or more second embodiments, further to the first embodiments, the non-planar FETs are n-type FETs comprising n-type source and drain structures.

In one or more third embodiments, further to the first or second embodiments, the IC die comprises a plurality of metallization layers over a front side of the non-planar FETs, the metallization layers to provide signal routing for the non-planar FETs, and wherein the cooling structure is over the plurality of first metallization layers.

In one or more fourth embodiments, further to the first through third embodiments, the cooling structure comprises a plurality of microchannels in the IC die and over the plurality of metallization layers, the microchannels to convey a heat transfer fluid therein.

In one or more fifth embodiments, further to the first through fourth embodiments, a metallization feature of the metallization layers is laterally adjacent to the microchannels.

In one or more sixth embodiments, further to the first through fifth embodiments, the cooling structure further comprises a chiller mounted to the IC die over the microchannels, the chiller comprising one of a solid body comprising second microchannels to convey a second heat transfer fluid therein or a heat sink for immersion in a low-boiling point liquid.

In one or more seventh embodiments, further to the first through sixth embodiments, the IC die comprises a plurality of second metallization layers over a back side of the non-planar FETs, the second metallization layers to provide power delivery for the non-planar FETs.

In one or more eighth embodiments, further to the first through seventh embodiments, the first functional circuit block comprises a NAND logic circuit.

In one or more ninth embodiments, further to the first through eighth embodiments, the first functional circuit block comprises one of a processor core, a controller device, a programmable logic device, or a field programmable gate array, and the non-planar FETs consist of not fewer than 100,000 n-type FETs.

In one or more tenth embodiments, further to the first through ninth embodiments, the non-planar FETs comprise one of Fin FETs, gate all around FETs, nanosheet FETs, or floating Fin FETs, and wherein the IC die consists of non-planar FETs all of the single conductivity type.

In one or more eleventh embodiments, further to the first through tenth embodiments, the cooling structure is to convey liquid nitrogen to achieve an operating temperature at or below about −196° C.

In one or more twelfth embodiments, a system comprises an apparatus according to any of the apparatuses of the first through eleventh embodiments, the system further comprising a power supply coupled to one or both of the IC die and the cooling structure.

In one or more thirteenth embodiments, an integrated circuit (IC) die comprises a processor core, the processor core consisting of a plurality of non-planar field effect transistors (FETs), wherein each of the non-planar FETs comprises an n-type source and drain, a plurality of first metallization layers over a front side of the non-planar FETs, the metallization layers to provide signal routing for the non-planar FETs, a plurality of microchannels over the plurality of metallization layers, the microchannels to convey a heat transfer fluid therein, and a plurality of second metallization layers over a back side of the non-planar FETs, the second metallization layers to provide power delivery for the non-planar FETs.

In one or more fourteenth embodiments, further to the thirteenth embodiments, the IC die further comprises a functional circuit block consisting of a plurality of second non-planar FETs, wherein each of the second non-planar FETs comprises an n-type source and drain.

In one or more fifteenth embodiments, further to the thirteenth or fourteenth embodiments, the functional circuit block comprises one of a controller device, a programmable logic device, or a field programmable gate array.

In one or more sixteenth embodiments, further to the thirteenth through fifteenth embodiments, the non-planar FETs comprise one of Fin FETs, gate all around FETs, nanosheet FETs, or floating Fin FETs.

In one or more seventeenth embodiments, further to the thirteenth through sixteenth embodiments, the microchannels are to convey liquid nitrogen to achieve an operating temperature of the IC die at or below about −196° C.

In one or more eighteenth embodiments, a method comprises forming a functional circuit block over a substrate, the functional circuit block consisting of a plurality of non-planar field effect transistors (FETs) all of a single conductivity type, forming a plurality of metallization layers over a front side of the non-planar FETs, the metallization layers to provide signal routing for the non-planar FETs, and providing cooling structure operable to remove heat from the functional circuit block to achieve an operating temperature at or below −25° C.

In one or more nineteenth embodiments, further to the eighteenth embodiments, providing the cooling structure comprises forming a plurality of microchannels over the metallization layers, the microchannels to convey a heat transfer fluid therein.

In one or more twentieth embodiments, further to the eighteenth or nineteenth embodiments, wherein providing the cooling structure comprises dicing an integrated circuit (IC) die from the substrate, and coupling a chiller to the IC die.

In one or more twenty-first embodiments, further to the eighteenth through twentieth embodiments, the method further comprises forming a plurality of second metallization layers over a back side of the non-planar FETs, the second metallization layers to provide power delivery for the non-planar FETs.

In one or more twenty-second embodiments, further to the eighteenth through twenty-first embodiments, the non-planar FETs comprise n-type FETs.

In one or more twenty-third embodiments, further to the eighteenth through twenty-second embodiments, the non-planar FETs comprise one of Fin FETs, gate all around FETs, nanosheet FETs, or floating Fin FETs.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:
1. An apparatus, comprising:
an integrated circuit (IC) die comprising:
one or more functional circuit blocks, wherein a first of the functional circuit blocks consists of a plurality of non-planar field effect transistors (FETs) all of a single conductivity type;
a plurality of metallization layers in the IC die and over a front side of the non-planar FETs, the metallization layers to provide signal routing for the non-planar FETs;
a die level cooling structure integral to the IC die, the die level cooling structure comprising a plurality of microchannels in the IC die and over the front side of the non-planar FETs, the microchannels to convey a heat transfer fluid therein, wherein a metallization feature of the metallization layers is laterally adjacent to the microchannels in the IC die, the metallization feature to provide at least a portion of the signal routing for the non-planar FETs; and
a package level cooling structure attached to the IC die over the die level cooling structure, the die level cooling structure and the package level cooling structure operable to remove heat from the IC die to achieve an operating temperature at or below −25° C.

2. The apparatus of claim 1, wherein the non-planar FETs are n-type FETs comprising n-type source and drain structures.

3. The apparatus of claim 1, wherein the package level cooling structure comprises a chiller, the chiller comprising one of a solid body comprising second microchannels to convey a second heat transfer fluid therein or a heat sink for immersion in a low-boiling point liquid.

4. The apparatus of claim 1, wherein the IC die comprises a plurality of second metallization layers over a back side of the non-planar FETs, the second metallization layers to provide power delivery for the non-planar FETs.

5. The apparatus of claim 1, wherein the first functional circuit block comprises a NAND logic circuit.

6. The apparatus of claim 1, wherein the first functional circuit block comprises one of a processor core, a controller device, a programmable logic device, or a field programmable gate array, and the non-planar FETs consist of not fewer than 100,000 n-type FETs.

7. The apparatus of claim 1, wherein the non-planar FETs comprise one of Fin FETs, gate all around FETs, nanosheet FETs, or floating Fin FETs, and wherein the IC die consists of non-planar FETs all of the single conductivity type.

8. The apparatus of claim 1, wherein the die level cooling structure and/or the package level cooling structure are to convey liquid nitrogen to achieve an operating temperature at or below about −196° C.

9. A monolithic integrated circuit (IC) die, comprising:
a processor core, the processor core consisting of a plurality of non-planar field effect transistors (FETs), wherein each of the non-planar FETs comprises an n-type source and drain;
a plurality of first metallization layers over a front side of the non-planar FETs, the metallization layers to provide signal routing for the non-planar FETs;
a die level cooling structure integral to the monolithic IC die, the die level cooling structure comprising a plurality of microchannels in the IC die and over the front side of the non-planar FETs, the microchannels to convey a heat transfer fluid therein, wherein a metallization feature of the first metallization layers is laterally adjacent to the microchannels in the IC die, the metallization feature to provide at least a portion of the signal routing for the non-planar FETs; and
a plurality of second metallization layers over a back side of the non-planar FETs, the second metallization layers to provide power delivery for the non-planar FETs.

10. The monolithic IC die of claim 9, further comprising a functional circuit block consisting of a plurality of second non-planar FETs, wherein each of the second non-planar FETs comprises an n-type source and drain.

11. The monolithic IC die of claim 10, wherein the functional circuit block comprises one of a controller device, a programmable logic device, or a field programmable gate array.

12. The monolithic IC die of claim 9, wherein the non-planar FETs comprise one of Fin FETs, gate all around FETs, nanosheet FETs, or floating Fin FETs.

13. The monolithic IC die of claim 9, wherein the microchannels are to convey liquid nitrogen to achieve an operating temperature of the IC die at or below about −196° C.

14. An apparatus, comprising:
the monolithic IC die of claim 9; and
a package level cooling structure attached to the monolithic IC die over the die level cooling structure, the die level cooling structure and the package level cooling structure operable to remove heat from the monolithic IC die to achieve an operating temperature at or below −25° C.

15. The apparatus of claim 14, wherein the package level cooling structure comprises a chiller, the chiller comprising one of a solid body comprising second microchannels to convey a second heat transfer fluid therein or a heat sink for immersion in a low-boiling point liquid.

16. A monolithic integrated circuit (IC) die, comprising:
one or more functional circuit blocks, wherein a first of the functional circuit blocks consists of a plurality of non-planar field effect transistors (FETs) all of a single conductivity type;
a plurality of metallization layers in the monolithic IC die and over a front side of the non-planar FETs, the metallization layers to provide signal routing for the non-planar FETs;
a die level cooling structure integral to the monolithic IC die, the die level cooling structure comprising a plurality of microchannels in the monolithic IC die and over the front side of the non-planar FETs, the microchannels to convey a heat transfer fluid therein, wherein a metallization feature of the metallization layers is laterally adjacent to the microchannels in the monolithic IC die, the metallization feature to provide at least a portion of the signal routing for the non-planar FETs.

17. The monolithic IC die of claim 16, further comprising a plurality of second metallization layers over a back side of the non-planar FETs, the second metallization layers to provide power delivery for the non-planar FETs.

18. The monolithic IC die of claim 16, further comprising a functional circuit block consisting of a plurality of second non-planar FETs, wherein each of the second non-planar FETs comprises an n-type source and drain.

19. The monolithic IC die of claim 16, wherein the non-planar FETs comprise one of Fin FETs, gate all around FETs, nanosheet FETs, or floating Fin FETs.

20. The monolithic IC die of claim 16, wherein the microchannels are to convey liquid nitrogen to achieve an operating temperature of the IC die at or below about −196° C.

21. An apparatus, comprising:
the monolithic IC die of claim 16; and
a package level cooling structure attached to the monolithic IC die over the die level cooling structure, the die level cooling structure and the package level cooling structure operable to remove heat from the monolithic IC die to achieve an operating temperature at or below −25° C.

22. The apparatus of claim 21, wherein the package level cooling structure comprises a chiller, the chiller comprising one of a solid body comprising second microchannels to convey a second heat transfer fluid therein or a heat sink for immersion in a low-boiling point liquid.

* * * * *